US007632153B1

(12) United States Patent
Lai et al.

(10) Patent No.: US 7,632,153 B1
(45) Date of Patent: Dec. 15, 2009

(54) ELECTRICAL CONNECTOR AND METHOD OF MANUFACTURING THE SAME

(75) Inventors: Ming-Chun Lai, Taipei Hsien (TW); Yu Li, Taipei Hsien (TW)

(73) Assignee: Cheng Uei Precision Industry Co., Ltd., Taipei Hsien (TW)

( * ) Notice: Subject to any disclaimer, the term of this patent is extended or adjusted under 35 U.S.C. 154(b) by 6 days.

(21) Appl. No.: 12/184,540

(22) Filed: Aug. 1, 2008

(51) Int. Cl.
*H01R 33/00* (2006.01)
*H05K 3/30* (2006.01)

(52) U.S. Cl. .......................... 439/660; 29/883; 439/862

(58) Field of Classification Search ................. 439/626, 439/627, 550, 66, 660, 862
See application file for complete search history.

(56) References Cited

U.S. PATENT DOCUMENTS

| | | | | |
|---|---|---|---|---|
| 5,338,231 | A * | 8/1994 | Wilhite | 439/660 |
| 6,068,519 | A * | 5/2000 | Lok | 439/660 |
| 6,219,913 | B1 * | 4/2001 | Uchiyama | 29/883 |
| 6,447,338 | B1 * | 9/2002 | Bricaud et al. | 439/862 |
| 6,988,916 | B2 * | 1/2006 | Taguchi | 439/862 |
| 7,357,665 | B1 * | 4/2008 | Yan | 439/500 |
| 2002/0048999 | A1 * | 4/2002 | Ming-Hui | 439/660 |
| 2002/0049000 | A1 * | 4/2002 | Tanaka et al. | 439/660 |
| 2003/0216067 | A1 * | 11/2003 | Yeh | 439/83 |

* cited by examiner

*Primary Examiner*—Briggitte R Hammond
(74) *Attorney, Agent, or Firm*—WPAT, P.C.; Anthony King; Kay Yang

(57) ABSTRACT

An electrical connector includes a dielectric housing and a plurality of electrical terminals integrated with the dielectric housing. A top of the dielectric housing defines a plurality of locating slots. A bottom of each locating slot defines a manufacturing hole. Each electrical terminal has a plate-shaped fixing portion embedded in the dielectric housing. A connecting end extends from one end of the fixing portion and out of the dielectric housing. A bending portion is bent upward from the other end of the fixing portion, and a contact portion obliquely extends from a top end of the bending portion. The fixing portion defines a fixing hole therein with respect to the contact portion. The fixing hole is located corresponding to and communicating with the manufacturing hole. The contact portion is received in the locating slot and covers the manufacturing hole.

3 Claims, 4 Drawing Sheets

ELECTRICAL CONNECTOR AND METHOD OF MANUFACTURING THE SAME

BACKGROUND OF THE INVENTION

1. Field of the Invention

This present invention relates to a connector, and more specifically to an electrical connector and a method of manufacturing the same.

2. The Related Art

A conventional electrical connector includes a housing and a plurality of electrical terminals. The electrical connector is manufactured in a mold. One end of each of the electrical terminals which does not need to be surrounded by the housing is fixed by the mold, then fluent plastic material is injected into the mold to form the housing, later the mold is cooled and opened, the electrical terminals are integrated with the housing, the manufacturing electrical connector is finished.

However, when the fluent plastic material is injected into the mold, just one end of each of the electrical terminals is fixed by the mold, which is easy to be removed or deformed by the flow of the fluent plastic material, which will affect the characteristic of the electrical connector.

SUMMARY OF THE INVENTION

An object of the invention is to provide an electrical connector molded in a mold. The electrical connector includes a dielectric housing and a plurality of electrical terminals integrated with the dielectric housing. A top of the dielectric housing defines a plurality of locating slots. A bottom of each locating slot defines a manufacturing hole. Each electrical terminal has a plate-shaped fixing portion embedded in the dielectric housing. A connecting end extends from one end of the fixing portion and out of the dielectric housing. A bending portion is bent upward from the other end of the fixing portion and a contact portion extends from a top end of the bending portion to be located above the fixing portion. The fixing portion defines a fixing hole with respect to the contact portion. The fixing hole is located corresponding to and communicating with the manufacturing hole. The contact portion is received in the locating slot and covers the manufacturing hole.

Another object of the invention is to provide a method for manufacturing the electrical connector. The method includes following steps: stamping a metal plate to form a plurality of electrical terminals apart from each other, wherein the electrical terminal has a fixing portion and a contact portion located above the fixing portion; defining a fixing hole in the fixing portion with respect to the contact portion; fixing the electrical terminals in a mold which has an upper submold and a lower submold, wherein the lower submold has a plurality of pins inserted through the respective fixing holes and against a bottom of the contact portion, and the upper submold is against a top of the contact portion; injecting fluent plastic material into a cavity between the upper and lower submolds to form a dielectric housing embedding the electrical terminals; taking out the electrical connector from the cavity when the mold is opened.

As the fixing hole is defined in each electrical terminal and the pin is defined in the mold to insert through the respective fixing hole of the electrical terminal, the electrical terminal is fastened firmly, which prevents the electrical terminals moving in the mold when the fluent plastic material is injected into the cavity of the mold, the electrical terminals are exactly positioned in the dielectric housing.

BRIEF DESCRIPTION OF THE DRAWINGS

The invention, together with its objects and the advantages thereof may be best understood by reference to the following description taken in conjunction with the accompanying drawings, in which.

DETAILED DESCRIPTION OF THE PREFERRED EMBODIMENT

Figure 1:
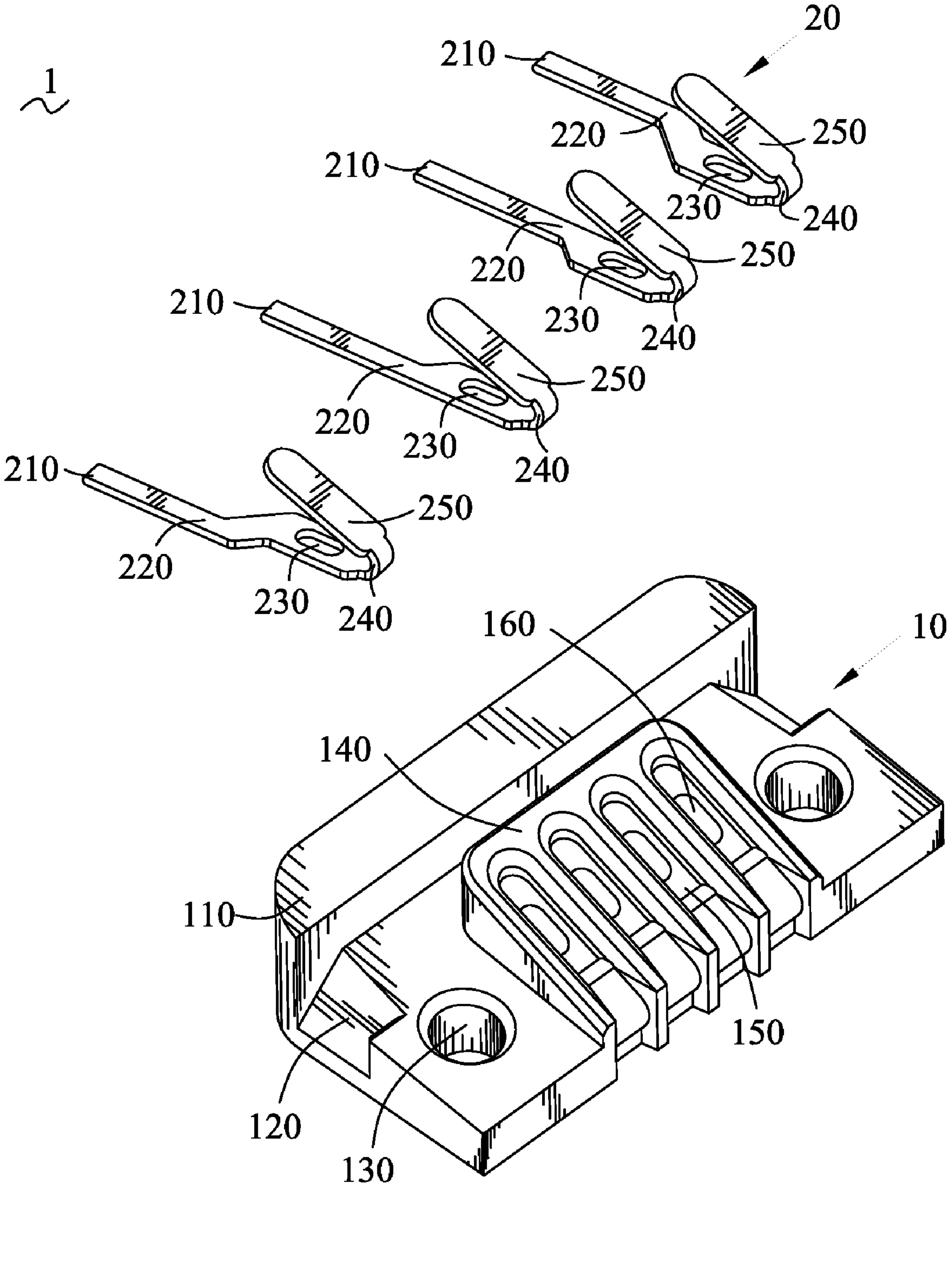
FIG. 1 is an exploded perspective of an electrical connector according to the present invention.
Figure 2:
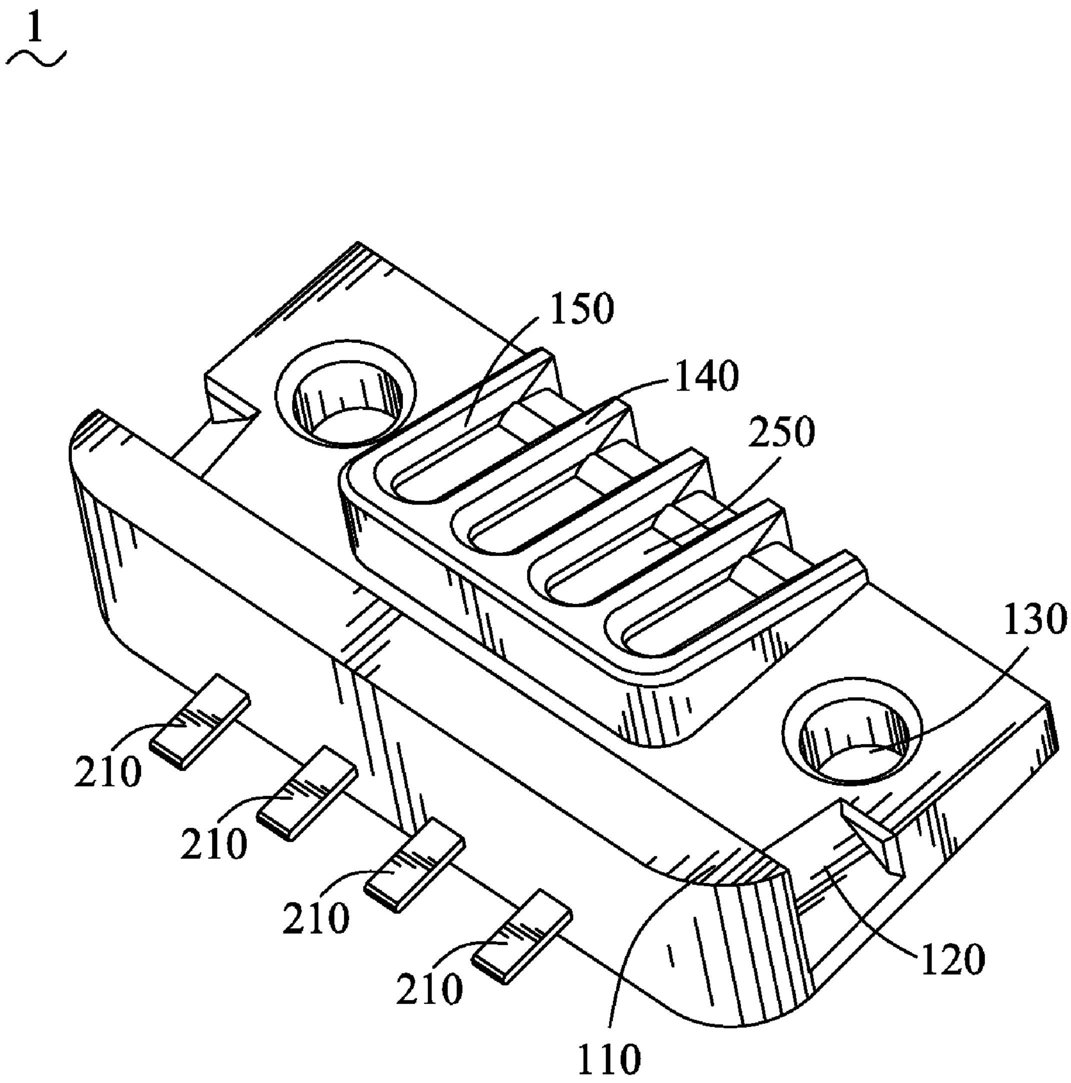
FIG. 2 is a perspective of the electrical connector in FIG. 1.
Figure 3:
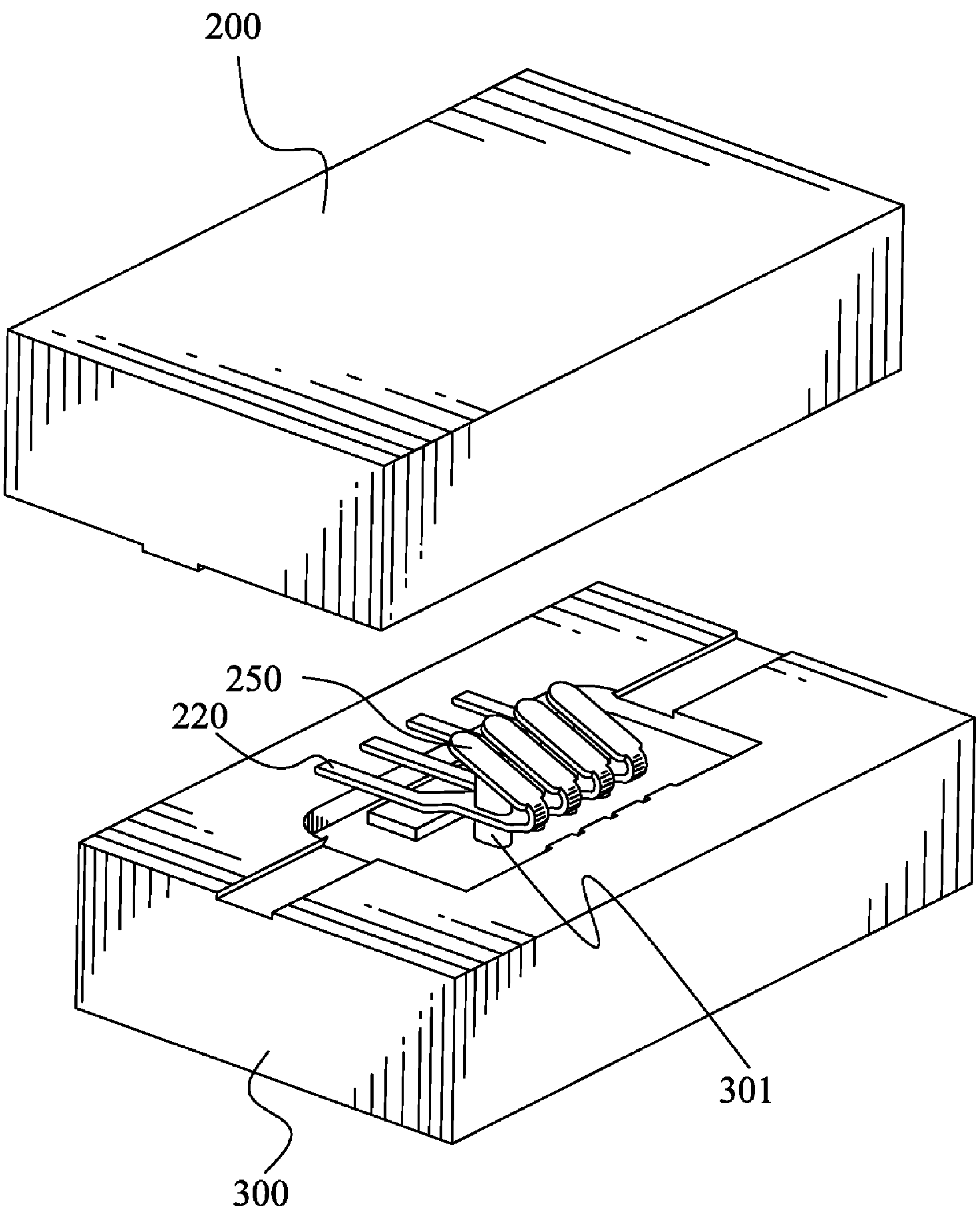
FIG. 3 is an exploded view of a mold, with electrical terminals of the electrical connector placed in a lower submold thereof.
Figure 4:
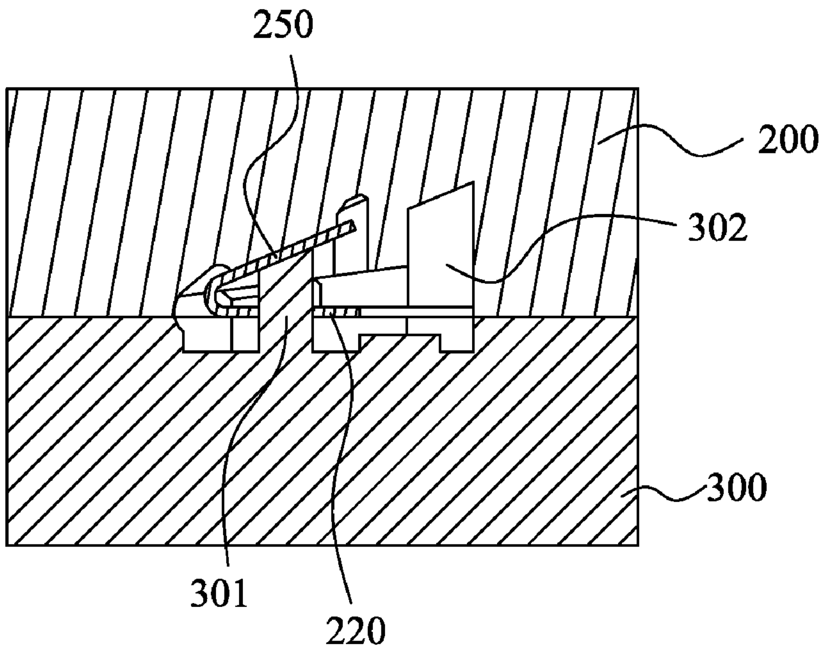
FIG. 4 is a cross-sectional view of the mold, with the electrical terminals placed therein.
Figure 5:
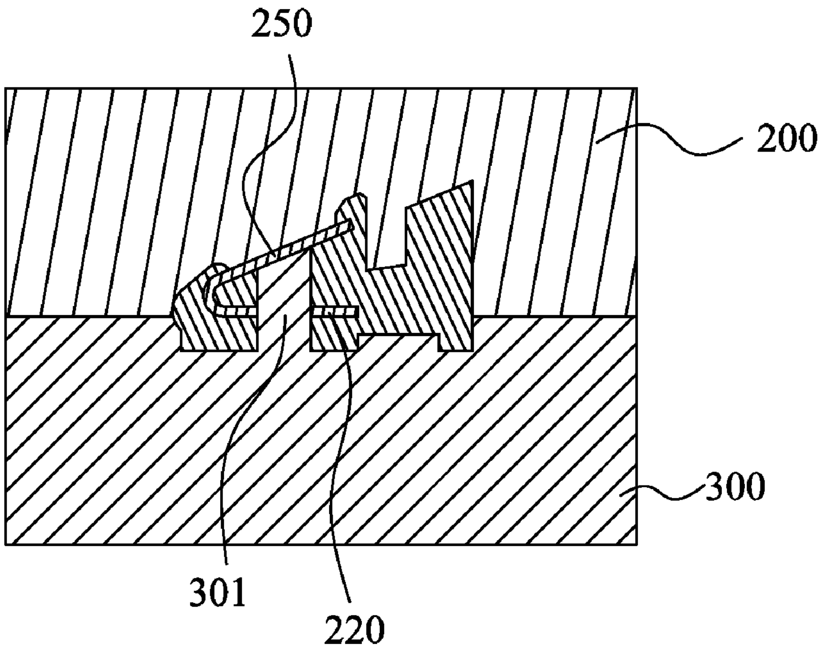
FIG. 5 is a cross-sectional view of the mold, with the electrical connector formed therein.

First referring to FIGS. 1 and 2, an electrical connector 1 according to the present invention is shown. The electrical connector 1 includes a dielectric housing 10 and four electrical terminals 20. The electrical terminals 20 are integrated with the dielectric housing 10.

Please referring to FIGS. 1-5, the dielectric housing 10 is molded in a mold by injecting fluent plastic material in to a cavity 302 which is formed in a mold. The dielectric housing 10 has a projection 110, two inclined planes 120 and two fastening apertures 130. The two inclined planes 120 and the two fastening aperture 130 are respectively arranged symmetrically in two sides of the dielectric housing 10. The middle of the dielectric housing 10 projects upward to form a contacting projection 140. A top surface of the contacting projection 140 extrudes inward to form four locating slots 150 spaced away from each other. A manufacturing hole 160 is formed in each of the locating slot 150. For fastening the electrical terminals 20 in the mold which includes a lower submold 300 and an upper submold 200, a plurality of pins 301 is arranged in the lower submold 300, when the fluent plastic material is injected into the cavity 302, the manufacturing holes 160 are formed in the dielectric housing 10.

Each of the electrical terminals 20 has a fixing portion 220, a connecting end 210 extending from a rear end of the fixing portion 220, a bending portion 240 extending and bending upward from a front end of the fixing portion 220, and a contact portion 250 obliquely extending from the top end of the bending portion 240, wherein the contact portion 250 forms an acute angle with the fixing portion 220. The connecting end 210 is adapted for connecting a printed circuited board or other electronic device. A fixing hole 230 is defined in the fixing portion 220 with respect to the contact portion 250. When the electrical terminals 20 are integrated with the dielectric housing 10, the fixing holes 230 are positioned corresponding to and communicating with the respective manufacturing holes 160.

The method for manufacturing the electrical connector 1 includes following steps: firstly, stamp a metal plate to form a plurality of electrical terminals 20 apart from each other, wherein each electrical terminal 20 has a fixing portion 220 and a contact portion 250 located above the fixing portion 220; secondly, define a fixing hole 230 in the fixing portion 220 with respect to the contact portion 250; thirdly, fix the electrical terminals 20 in the mold, wherein the pins 301 of the lower submold 300 are inserted through the respective fixing holes 230 and against a bottom of the contact portion 250, and the upper submold 200 is against a top of the contact portion 250; fourthly, inject fluent plastic material into the cavity 302 formed between the upper and lower submolds 200, 300 to form the dielectric housing 10; and finally take out the electrical connector 1 from the cavity 302 when the mold is opened.

As the fixing hole 230 is defined in each of the electrical terminals 20 and the pin 301 is defined in the mold to insert through the respective fixing hole 230 of the electrical terminal 20, the electrical terminal 20 is fastened firmly, which prevents the electrical terminals 20 moving in the mold when the fluent plastic material is injected into the cavity 302 of the mold. So the electrical terminals 20 are exactly positioned in the dielectric housing 10.

An embodiment of the present invention has been discussed in detail. However, this embodiment is merely a specific example for clarifying the technical contents of the present invention and the present invention is not to be construed in a restricted sense as limited to this specific example. Thus, the spirit and scope of the present invention are limited only by the appended claims.

What is claimed is:

1. An electrical connector produced by insert molding in a mold with pins formed therein, comprising:

a dielectric housing having at least two inclined planes, a middle section of said housing projecting upward to form a contacting projection wherein the contacting projection is located on a top of the dielectric housing to define a plurality of locating slots, a bottom of each of said plurality of locating slots defining a manufacturing hole; and a plurality of electrical terminals insert molded to the dielectric housing by being preplaced in the mold, each of the electrical terminals having a plate-shaped fixing portion embedded in the dielectric housing, a connecting end extending from one end of the fixing portion and out of the dielectric housing, a bending portion bent upward from the other end of the fixing portion, and a contact portion extending obliquely from a top end of the bending portion, the fixing portion defining a fixing hole therein with respect to the contact portion for engaging with the corresponding pin to locate the electrical terminal in the mold, the fixing hole located corresponding to and communicating with the manufacturing hole which is formed because of the corresponding pin being drawn out after insert molding, the contact portion being received in the locating slot and covering the manufacturing hole.

2. The electrical connector as claimed in claim 1, wherein the contact portion forms an acute angle with the fixing portion.

3. A method for manufacturing an electrical connector, comprising:

stamping a metal plate to form a plurality of electrical terminals apart from each other, wherein each of the electrical terminals has a fixing portion and a contact portion located above the fixing portion;

defining a fixing hole in the fixing portion with respect to the contact portion;

fixing the electrical terminals in a mold which has an upper submold and a lower submold, wherein the lower submold has a plurality of pins inserted through the respective fixing holes and against a bottom of the contact portion, and the upper submold is against a top of the contact portion;

injecting fluent plastic material into a cavity between the upper and lower submolds to form a dielectric housing embedding the electrical terminals; and taking out the electrical connector from the cavity when the mold is opened, with a manufacturing hole formed because of the corresponding pin being drawn out.

* * * * *